(12) United States Patent
Bera

(10) Patent No.: US 8,176,108 B2
(45) Date of Patent: May 8, 2012

(54) METHOD, APPARATUS AND COMPUTER PROGRAM PRODUCT FOR NETWORK DESIGN AND ANALYSIS

(75) Inventor: Rajendra Kumar Bera, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 1686 days.

(21) Appl. No.: 11/287,100

(22) Filed: Nov. 23, 2005

(65) Prior Publication Data

US 2006/0080071 A1  Apr. 13, 2006

Related U.S. Application Data

(60) Continuation-in-part of application No. 11/231,091, filed on Sep. 20, 2005, which is a division of application No. 09/597,478, filed on Jun. 20, 2000, now Pat. No. 7,043,510.

(51) Int. Cl.
 *G06F 7/38* (2006.01)
(52) U.S. Cl. ...................................................... 708/446
(58) Field of Classification Search .................. 708/200, 708/446, 495
See application file for complete search history.

(56) References Cited

U.S. PATENT DOCUMENTS

| | | | |
|---|---|---|---|
| 3,621,209 A | 11/1971 | Businger | |
| 4,692,896 A | 9/1987 | Sakoda | |
| 4,845,652 A * | 7/1989 | Bunsen | 708/144 |
| 5,151,991 A | 9/1992 | Iwasawa | |
| 5,159,552 A | 10/1992 | van Gasteren | |
| 5,200,915 A | 4/1993 | Hayami | |
| 5,216,627 A | 6/1993 | McClellan | |
| 5,237,685 A * | 8/1993 | Toney | 708/446 |
| 5,274,812 A | 12/1993 | Inoue | |
| 5,343,554 A | 8/1994 | Koza | |
| 5,363,473 A | 11/1994 | Stolfo | |
| 5,392,429 A * | 2/1995 | Agrawal et al. | 708/446 |
| 5,442,569 A * | 8/1995 | Osano | 716/20 |

(Continued)

FOREIGN PATENT DOCUMENTS

JP  7244647  9/1995

(Continued)

OTHER PUBLICATIONS

Steven J. Leon, Linear Algebra with Applications, 1998, Prentice Hall, $5^{th}$ edition, pp. 1-83.*

(Continued)

*Primary Examiner* — Tan Mai
(74) *Attorney, Agent, or Firm* — Anthony V. S. England; William Steinberg

(57) ABSTRACT

A first representation of an electrical network includes a first set of simultaneous linear algebraic equations (SLAE's). A second representation of an electrical network includes a second set of SLAE's. The equations of the SLAE's include a number of unknowns and have coefficients for the respective unknowns. A number of the coefficients are expressed in algebraic form. The coefficients of one such equation from one of the sets of SLAE's are for respective elements of the set's respective electrical network and the unknowns are for respective operating properties of the set's respective electrical network. Results are derived in pairs for each unknown of each respective one of the SLAE's. The pairs of results are compared in a specified manner to determine a network equivalence. The results are derived from the SLAE's and expressed in algebraic form, so that the comparing of the pairs of results includes comparing algebraic expressions.

18 Claims, 3 Drawing Sheets

U.S. PATENT DOCUMENTS

| | | | | |
|---|---|---|---|---|
| 5,481,723 | A | 1/1996 | Harris | |
| 5,666,533 | A | 9/1997 | Horiguchi | |
| 5,680,557 | A * | 10/1997 | Karamchetty | 715/866 |
| 5,842,022 | A | 11/1998 | Nakahira | |
| 5,905,892 | A | 5/1999 | Nielsen | |
| 6,006,230 | A | 12/1999 | Ludwig | |
| 6,009,267 | A | 12/1999 | Ogawa | |
| 6,026,235 | A | 2/2000 | Shaughnessy | |
| 6,032,144 | A | 2/2000 | Srivastava | |
| 6,061,676 | A | 5/2000 | Srivastava | |
| 6,097,815 | A * | 8/2000 | Shimada | 708/250 |
| 6,144,932 | A * | 11/2000 | Hachiya | 708/446 |
| 6,182,284 | B1 | 1/2001 | Sreedhar | |
| 6,209,016 | B1 | 3/2001 | Hobson | |
| 6,237,139 | B1 | 5/2001 | Hotta | |
| 6,282,704 | B1 | 8/2001 | Iitsuka | |
| 6,286,135 | B1 | 9/2001 | Santhanam | |
| 6,289,443 | B1 | 9/2001 | Scales | |
| 6,292,168 | B1 | 9/2001 | Venable | |
| 6,339,840 | B1 | 1/2002 | Kothari | |
| 6,349,318 | B1 | 2/2002 | Vanstone | |
| 6,367,071 | B1 | 4/2002 | Cao | |
| 6,374,403 | B1 | 4/2002 | Darte | |
| 6,415,433 | B1 | 7/2002 | Callahan, II | |
| 6,427,234 | B1 | 7/2002 | Chambers | |
| 6,507,947 | B1 | 1/2003 | Schreiber | |
| 6,539,541 | B1 | 3/2003 | Geva | |
| 6,578,196 | B1 | 6/2003 | Bera | |
| 6,601,080 | B1 | 7/2003 | Garg | |
| 6,654,953 | B1 | 11/2003 | Beaumont | |
| 6,708,331 | B1 | 3/2004 | Schwartz | |
| 6,721,941 | B1 | 4/2004 | Morshed | |
| 6,738,967 | B1 | 5/2004 | Radigan | |
| 6,745,215 | B2 | 6/2004 | Bera | |
| 6,745,384 | B1 | 6/2004 | Biggerstaff | |
| 6,826,585 | B2 * | 11/2004 | Mitsunaga et al. | 708/446 |
| 6,948,161 | B2 | 9/2005 | Bera | |
| 7,043,510 | B1 | 5/2006 | Bera | |
| 7,076,777 | B2 | 7/2006 | Srinivasan | |
| 7,089,545 | B2 | 8/2006 | Bera | |
| 7,171,544 | B2 | 1/2007 | Bera | |
| 7,337,437 | B2 | 2/2008 | Bera | |
| 7,836,112 | B2 | 11/2010 | Bera | |
| 2001/0003211 | A1 | 6/2001 | Bera | |
| 2002/0007385 | A1 | 1/2002 | Stoutemyer | |
| 2002/0016887 | A1 | 2/2002 | Scales | |
| 2002/0178196 | A1 | 11/2002 | Monier | |
| 2003/0018671 | A1 | 1/2003 | Bera | |
| 2003/0056083 | A1 | 3/2003 | Bates | |
| 2003/0120900 | A1 | 6/2003 | Stotzer | |
| 2004/0019622 | A1 | 1/2004 | Elbe | |
| 2004/0158691 | A1 | 8/2004 | Redford | |
| 2004/0220989 | A1 | 11/2004 | Elbe | |
| 2005/0028141 | A1 | 2/2005 | Kurhekar | |
| 2006/0015550 | A1 | 1/2006 | Bera | |
| 2006/0036413 | A1 | 2/2006 | Campbell | |
| 2006/0041872 | A1 | 2/2006 | Poznanovic | |
| 2006/0080071 | A1 | 4/2006 | Bera | |
| 2007/0169061 | A1 | 7/2007 | Bera | |

FOREIGN PATENT DOCUMENTS

JP  11-110225  4/1999

OTHER PUBLICATIONS

Stoer et al., "Introduction to Numerical Analysis," 1980, Springer-Verlag, pp. 97-102, 144-147, and 159-161.

Ledermann, W., Algebra vol. 1 of Handbook of Applicable Mathematics, John Wiley & Sons, New York, 1980, Chapter 8.

Press, W.H., et al., Numerical Recipes in FORTRAN, Second Edition, Cambridge Univ. Press, 1992, Chapter 2.

Ralston, A., A First Course in Numerical Analysis, International Student Edition, McGraw-Hill, New York, 1965, Chapter 9.

Blume, W. et al., "The Range Test: A Dependence Test for Symbolic, Non-linear Expressions." IEEE 1994, pp. 528-537.

Cmelik et al., Dimensional Analysis with C++, IEEE May 1988, pp. 21-27.

Huang, Tsung-Chuan and Po-Hsueh Hsu, "A Practical run-time technique for exploiting loop-level parallelism." Journal of Systems and Software 54 (2000), pp. 259-271.

Huang, Tsung-Chuan and Cheng-Ming Yang, "Non-linear array data dependence test." Journal of Systems and Software 57 (2001), pp. 145-154.

Huang et al. "An Efficient Run-Time Scheme for Exploring Parallelism on Multiptocessor Systems", M. Valero, V. K. Prasanna, and S. Vajapeyam (Eds.):: HiPC2000, LNCS 1970, pp. 27-36 (2000).

Hwang, J. J. et al., "A New Access Control Method Using Prime Factorisation." The Computer Journal, vol. 35, No. 1, 1992, pp. 16-20.

Koblitz, Neal, Algebraic Aspects of Cryptography. Springer: 1999. p. 28.

Novak et al., Conversion of Units of Measurement. IEEE Transactions On Software Engineering, vol. 21, No. 8, Aug. 1995, pp. 651-661.

Pottenger, W. M.; Induction Variable Substitution and Reduction Recognition in the Polaris Parallelizing Compiler, 1980, 70 pages.

Rauchwerger et al., The LRPD Test: Speculative Run-Time Parallelization of Loops with Privatization and Reduction Parallelixation; IEEE Transactions on Parallel and Distributed Systems, vol. 10, No. 2, Feb. 1999, pp. 160-180.

Rauchwerger, L., Run-Time Parallelization: It's Time Has Come; Journal of Parallel Computing, Special Issue on Language and Compilers, vol. 24, Nos. 3-4, 1998, pp. 527-556.

Rosen et al., Global Value Numbers and Redundant Computations; ACM, Jan. 1988. pp. 12-27.

Schofield, C.F., Optimising Fortran Programs, Ellis Howood Limited, Chichester, 1989.

Suganuma et al., Detection and Global Optimization of Reduction Operations for Distributed Parallel Machines; 1996, ACM. pp. 18-25.

Tanenbaum, Andrew S., Structured Computer Organization. Second Edition. Prentice-Hall, Inc. 1984. pp. 11-12 and 10.

Dec. 17, 2002 Notice of Allowance for U.S. Appl. No. 09/589,394, filed Jun. 7, 2000; Confirmation No. 9153.

Apr. 3, 2003 Office Action for U.S. Appl. No. 09/597,478, filed Jun. 20, 2000; Confirmation No. 5293.

Jun. 27, 2003, Office Action for U.S. Appl. No. 09/728,096, filed Dec. 1, 2000; Confirmation No. 4541.

Sep. 5, 2003 Office Action for U.S. Appl. No. 09/839,025, filed Apr. 20, 2001; Confirmation No. 2392.

Dec. 1, 2003 filed Response to Office Action (Mail Date Sep. 5, 2003) for U.S. Appl. No. 09/839,025, filed Apr. 20, 2001; Confirmation No. 2392.

Dec. 1, 2003 Response to Office Action for U.S. Appl. No. 09/597,478, filed Jun. 20, 2000; Confirmation No. 5293.

Jan. 30, 2004 Notice of Allowance for U.S. Appl. No. 09/839,025, filed Apr. 20, 2001; Confirmation No. 2392.

Apr. 22, 2004 Office Action for U.S. Appl. No. 09/839,071, filed Apr. 20, 2001; Confirmation No. 2724.

Jul. 20, 2004 filed Response to Office Action (Mail Date Apr. 22, 2004) for U.S. Appl. No. 09/839,071, filed Apr. 20, 2001; Confirmation No. 2724.

Apr. 22, 2004 Decision on Petition to Revive, Petition to Review, and Response to Office Action (Mail Date Apr. 3, 2003) for U.S. Appl. No. 09/597,478, filed Jun. 20, 2000; Confirmation No. 5293. NOTE: Notice of Abandonment Feb. 4, 2004 for failing to Respond to Office Action. Apr. 22, 2004 Petition Granted.

Jul. 27, 2004 Final Office Action for U.S. Appl. No. 09/597,478, filed Jun. 20, 2000; Confirmation No. 5293.

Oct. 20, 2004 Office Action for U.S. Appl. No. 09/839,071, filed Apr. 20, 2001; Confirmation No. 2724.

Jan. 14, 2005 filed Response to Office Action (Mail Date Oct. 20, 2004) for U.S. Appl. No. 09/839,071, filed Apr. 20, 2001; Confirmation No. 2724.

Oct. 27, 2004 filed Request for Continued Examination (RCE) for U.S. Appl. No. 09/597,478, filed Jun. 20, 2000; Confirmation No. 5293.

Dec. 15, 2004 filed Petition to Revive and Response to Office Action (Mail Date Jun. 27 2003) for U.S. Appl. No. 09/728,096, filed Dec. 1, 2000; Confirmation No. 4541. Note: Notice of Abandonment Jan. 13, 2004 for failing to Respond to Office Action. Nov. 17, 2004 Petition Granted.
Jan. 5, 2005 Office Action for U.S. Appl. No. 09/597,478, filed Jun. 20, 2000; Confirmation No. 5293.
Apr. 5, 2005 filed Response to Office Action (Mail Date Jan. 5, 2005) for U.S. Appl. No. 09/597,478, filed Jun. 20, 2000; Confirmation No. 5293.
May 11, 2005 Notice of Allowance for U.S. Appl. No. 09/597,478, filed Jun. 20, 2000; Confirmation No. 5293.
Jun. 2, 2005 Notice of Allowance for U.S. Appl. No. 09/839,071, filed Apr. 20, 2001; Confirmation No. 2724.
Oct. 17, 2005 filed Response to Office Action (Mail Date Jun. 16, 2005) for U.S. Appl. No. 10/215,431, filed Aug. 7, 2002; Confirmation No. 1221.
Jun. 16, 2005 Nonfinal Office Action for U.S. Appl. No. 10/215,431, filed Aug. 7, 2002; Confirmation No. 1221.
Jan. 12, 2006 Notice of Allowance for U.S. Appl. No. 10/215,431, filed Aug. 7, 2002; Confirmation No. 1221.
Feb. 13, 2006 Office Action for U.S. Appl. No. 09/728,096, filed Dec. 1, 2000; Confirmation No. 4541.
May 11, 2006 Filed Response to Office Action (Mail Date Feb. 13, 2006) for U.S. Appl. No. 09/728,096, filed Dec. 1, 2000; Confirmation No. 4541.
Mar. 28, 2006 Notice of Allowance for U.S. Appl. No. 10/321,971, filed Dec. 17, 2002; Confirmation No. 5620.
May 5, 2006 Office Action for U.S. Appl. No. 10/736,343, filed Dec. 15, 2003; Confirmation No. 4635.
Sep. 5, 2006 filed Response to Office Action (Mail Date May 5, 2006) for U.S. Appl. No. 10/736,343, filed Dec. 15, 2003; Confirmation No. 4635.
Jul. 25, 2006 Final Office Action for U.S. Appl. No. 09/728,096, filed Dec. 1, 2000; Confirmation No. 4541.
Sep. 22, 2006 Filed Response to Final Office Action (Mail Date Jul. 25, 2006) for U.S. Appl. No. 09/728,096, filed Dec. 1, 2000; Confirmation No. 4541.
Sep. 28, 2006 Applicant summary of interview with examiner for U.S. Appl. No. 10/736,343, filed Dec. 15, 2003; Confirmation No. 4635.
Sep. 29, 2006 filed Amendment After Final for U.S. Appl. No. 10/736,343, filed Dec. 15, 2003; Confirmation No. 4635.
Oct. 4, 2006 Notice of Allowance for U.S. Appl. No. 10/736,343, filed Dec. 15, 2003; Confirmation No. 4635.
Oct. 20, 2006 Office Action for U.S. Appl. No. 09/728,096, filed Dec. 1, 2000; Confirmation No. 4541.
Jan. 22, 2007 Filed Response to Office Action (Mail Date Oct. 20, 2006) for U.S. Appl. No. 09/728,096, filed Dec. 1, 2000; Confirmation No. 4541.
Apr. 10, 2007 Final Office Action for U.S. Appl. No. 09/728,096, filed Dec. 1, 2000; Confirmation No. 4541.
Jun. 4, 2007 Filed Response to Final Office Action (Mail Date Apr. 10, 2007) for U.S. Appl. No. 09/728,096, filed Dec. 1, 2000; Confirmation No. 4541.
Jun. 28, 2007 Advisory Action for U.S. Appl. No. 09/728,096, filed Dec. 1, 2000; Confirmation No. 4541.
Jul. 9, 2007 Filed Request for Continued Examination (RCE) with Preliminary Amendment for U.S. Appl. No. 09/728,096, filed Dec. 1, 2000; Confirmation No. 4541.
Oct. 3, 2007 Notice of Allowance for U.S. Appl. No. 09/728,096, filed Dec. 1, 2000; Confirmation No. 4541.
Nov. 21, 2007 Filed Amendment under 37 CFR 1.312 for U.S. Appl. No. 09/728,096, filed Dec. 1, 2000; Confirmation No. 4541.
Jan. 8, 2008 Response to Rule 312 Communication for U.S. Appl. No. 09/728,096, filed Dec. 1, 2000; Confirmation No. 4541.
Jan. 28, 2008 Terminal Disclaimer Filed for U.S. Appl. No. 12/015,591, filed Jan. 17, 2008; Confirmation No. 2664.
Jan. 29, 2008 Request for Consideration for U.S. Appl. No. 12/015,591, filed Jan. 17, 2008; Confirmation No. 2664.
Mar. 18, 2008 Notice of Allowance for U.S. Appl. No. 12/015,591, filed Jan. 17, 2008; Confirmation No. 2664.
Feb. 18, 2010 Office Action for U.S. Appl. No. 11/231,091, filed Sep. 20, 2005; Confirmation No. 5563.
May 18, 2010 filed Response to Office Action (Mail Date Feb. 18, 2010) for U.S. Appl. No. 11/231,091, filed Sep. 20, 2005; Confirmation No. 5563.
May 21, 2010 Notice of Noncompliant Response for U.S. Appl. No. 11/231,091, filed Sep. 20, 2005; Confirmation No. 5563.
May 25, 2010 filed Response to Notice of Noncompliant Response (Mail Date May 21, 2010) for U.S. Appl. No. 11/231,091, filed Sep. 20, 2005; Confirmation No. 5563.
Jul. 9, 2010 Notice of Allowance for U.S. Appl. No. 11/231,091, filed Sep. 20, 2005; Confirmation No. 5563.
Oct. 26, 2010 Nonfinal Office Action for Patent Application Serial No. 11620586, filed Jan. 5, 2007; Confirmation No. 9520.
Jan. 25, 2011 Reply to Nonfinal Office Action for Patent Application Serial No. 11620586, filed Jan. 5, 2007; Confirmation No. 9520.
Feb. 9, 2011 NoticeOfAllowance for Patent Application Serial No. 11620586, filed Jan. 5, 2007; Confirmation No. 9520.
May 23, 2011 NoticeOfAllowance for Patent Application Serial No. 11620586, filed Jan. 5, 2007; Confirmation No. 9520.

* cited by examiner

METHOD, APPARATUS AND COMPUTER PROGRAM PRODUCT FOR NETWORK DESIGN AND ANALYSIS

CROSS REFERENCE TO RELATED APPLICATION

This is a continuation-in-part of application Ser. No. 11/231,091, filed on Sep. 20, 2005, which is a divisional of application Ser. No. 09/597,478, filed Jun. 20, 2000 now U.S. Pat. No. 7,043,510.

TECHNICAL FIELD OF THE INVENTION

The present invention relates to electrical networks, and in particular, to determining whether electrical networks are equivalent.

BACKGROUND ART

An understanding of time variation of voltages and currents in electrical networks is especially important in control systems, which include such electrical networks for processing measurements and manipulating control elements in real-time. Real-time control systems having electrical networks are used in a wide variety of applications, including temperature controls for heating and cooling units; speed, altitude, pitch and yaw controls for aircraft and spacecraft; etc. There are many more applications, from the exotic to the mundane—from medical devices to kitchen appliances.

In order to understand the time varying voltages and currents for a control system, the system's electrical networks must be modelled and analysed. Such an electrical network includes interconnected circuits of analog electrical elements such as resistors, inductors, capacitors, diodes, etc. A number of electrical laws apply to such electrical networks, in general. These include Kirchoff's current law, Kirchoff's voltage law, Ohm's law, the Y-delta transform, Norton's theorem, and Thevenin's theorem. An application of these laws results in a set of linear simultaneous equations for currents and voltages.

If the network has elements such as inductors and capacitors whose voltage-current relationship is described by linear operators, such as differential, integral, or integro-differential operators, then designers often use the well-known Laplace transform method in order to get the network equations into the form of linear algebraic equations. That is, the designers convert integro-differential network equations into simultaneous linear algebraic equations in the Laplace plane, which are generally simpler to solve. If the network has elements whose current-voltage relationship is governed by non-linear operators (algebraic, differential, integral, etc.), then designers dealing with such systems often linearize the equations about the desired operating point in order to study the system's off-design behaviour around the operating point.

Once the network equations have been set out as linear algebraic equations, the well-known Gaussian elimination method is often used to obtain a solution to the equations. If it was not necessary to transform the network equations to the Laplace plane in order to get them in linear algebraic form, and if all the network elements have known values, then the solution generally yields numeric values for network voltages and currents in the time domain. If the network equations were transformed to the Laplace plane in order to put them in linear algebraic form, a solution in the Laplace plane can be determined, such as by Gaussian elimination with respect to the transformed equations, and then an inverse Laplace transform can be applied to the solution in the Laplace plane. This transforms the equations from the Laplace plane back to the original, time-based domain. The solution to the time-domain equations yields numerical values for the network currents and voltages in the time domain; provided, once again, that particular values are known for each network element.

If particular values are not known for each network element, the solutions to the linear algebraic network equations will also generally be in algebraic form. Further, if the Laplace transform method has been applied to obtain the network equations in linear algebraic form, then the coefficient matrix for the equations in the Laplace plane will be algebraic due to the presence of the Laplace variable, even if numerical values of all the network elements are known. Hence the solution to the network equations in the Laplace plane will also be algebraic, even if numerical values of all the network elements are known.

Regardless of whether an electrical network is modelled by linear network equations or a linearized version of non-linear network equations, the branch voltages and currents of the network must satisfy respective sets of equations for three constraints: Kirchoff's current law; Kirchoff's voltage law; and branch voltage-current relationships. For a network having Nv nodes and Nb branches, the set for Kirchoff's current law has Nv−1 equations, the set for Kirchoff's voltage law has Nb−(Nv−1) equations and the set for branch voltage-current relationships has Nb equations. Thus the three sets together contain 2Nb equations.

Since for a network of Nv nodes there are only Nv−1 independent equations for Kirchoff's current law, the analyst may select which Nv−1 of the Nv nodes are used for the application of Kirchoff's current law. Likewise, the analyst may select which loops are used for the application of Kirchoff's voltage law, etc. The analyst has considerable choice regarding the nodes, loops and equations for modelling the network, as long as the analyst chooses a sufficient number of independent equations so as to permit the calculation of a unique solution. The various legitimate choices all lead to mathematically equivalent sets of network equations in which there are a total of 2Nb equations.

From the above it should be appreciated that in applications such as control system electrical network design and analysis the need arises to solve one or more systems of simultaneous linear algebraic equations (SLAE's), whose coefficient matrices may or may not be limited to merely numerical coefficients. Solutions of the SLAE's are conventionally obtained by using the well-known Gaussian elimination method. However, as described above such methods may not always work. Also, when a coefficient matrix has non-numerical coefficients, applying the Gaussian elimination method is difficult. Therefore, a need exists for improvements in this field.

DISCLOSURE OF THE INVENTION

The present invention is advantageous in this context for electrical network design and analysis, which is particularly useful for control system applications. The invention enables an algebraic-level design verification of electrical networks that have been specified as described above. That is, two or more sets of network equations can be specified for respective electrical networks or for the same network. Once the sets of network equations are suitably linearized and put into the form of respective sets of simultaneous linear algebraic equations (if they do not already appear in that form), equivalence of the represented electrical network or networks can be determined in order to verify that the equations have been correctly specified.

Advantageously, the present invention enables determining equivalence of the first and second electrical networks by comparing respective results derived from the sets of network equations, even if the results are expressed in algebraic form. (Alternatively, if the representations are both for the same electrical network, the representations are equivalent if the products match for all unknowns.) Thus, by application of the principles of the present invention the equivalency determination can be made unambiguously even when the elements of the coefficient matrices of the sets of network equations have non-numeric terms. As explained above, this will arise if network element values are unknown. Further, as also explained above, even if the network element values are known, the elements of the coefficient matrices of the sets of network equations will have non-numeric terms if the network equations have been transformed to the Laplace plane, as they generally are when the network equations are integro-differential equations.

Thus, the present invention enables determination of equivalency even if specific values are not known for network elements. Without specific known values for the network elements, equivalency could not be determined merely by Gaussian elimination. Further, the present invention enables determination of equivalency of sets of network equations even if the network equations are expressed in the Laplace plane. This eliminates the need to perform inverse Laplace transformations to determine equivalency.

In one form of the invention, a computer-implemented method for electrical network analysis includes receiving, by a computer system, a first representation of an electrical network. The representation includes a first set of simultaneous linear algebraic equations (SLAE's). A second representation of an electrical network is also received by the computer system that includes a second set of SLAE's. (The network representations may both be for the same electrical network, or they may be for respective first and second electrical networks. Also, while the above states that "representations" of an electrical network or networks that include SLAE's are received by the computer system, it should be understood that this includes receiving merely information about the electrical network or networks which the computer system formats into representations in the form of SLAE's.) The SLAE's include a number of unknowns, and the method includes deriving a certain pair of results for each unknown of each respective one of the SLAE's. The results are derived from the respective sets of SLAE's. The equations of the first and second sets of SLAE's have coefficients for the respective unknowns, a number of the coefficients being expressed in algebraic form so that the results are expressed in algebraic form. To determine a network equivalence the pairs of results are compared in a specified manner. Since the results are in algebraic form, the comparing of the results includes comparing algebraic expressions.

In another aspect of the invention, the deriving of such a pair of results for an unknown of the respective sets of SLAE's includes forming a first product for a first one of the results in such a pair. The first product includes a first part of a first standard form equation derived from the first set of SLAE's and second part of a second standard form equation derived from the second set of SLAE's. The deriving of such a pair of results also includes forming a second product for a second one of the results in such a pair. The second product includes a second part of the first one of the standard form equations derived from the first set of SLAE's and a first part of the second one of the standard form equations derived from the second set of SLAE's. The comparing of the pairs of results includes comparing respective ones of such first and second products.

In another aspect of the invention, each of the equations of the SLAE's are of a form:

$$e_{i1}x_1 + e_{i2}x_2 + e_{i3}x_3 + \ldots + e_{in}x_n = b_i$$

wherein $x_j$ are unknowns, $e_{ij}$ are coefficients, and $b_i$ are quantities. The coefficients may represent properties of elements of the electrical network and the unknowns may represent operating properties of the electrical network. For example, one such equation from the sets of SLAE's may satisfy Kirchoff's voltage law for at least a portion of the equation's respective electrical network. In this case, for example, one of the unknowns in the particular equation is an operating current through a number of branches that form a loop in the respective electrical network and one of the coefficients is a combination of element impedances for the elements of those branches forming the loop.

A first one of the standard form equations derived from the first set of SLAE's is of the form:

$$(l_{ii})_k x_i = (r_i)_k$$

with k=1. The first part of the equation is formed by $(l_{ii})_1$. the second part of the equation is formed by $(r_i)_1$. In the results, $l_{ii}$ and $r_i$ are algebraic expressions.

A second one of the standard form equations derived from the second set of SLAE's is of the form:

$$(l_{ii})_k x_i = (r_i)_k$$

with k=2. The first part of the equation is formed by $(l_{ii})_2$. The second part of the equations is formed by $(r_i)_2$.

One of the above described first products includes $(l_{ii})_1 * (r_i)_2$. One of the above described second product includes $(l_{ii})_2 * (r_i)_1$. The comparing of respective pairs of results includes comparing the products $(l_{ii})_1 * (r_i)_2$ and $(l_{ii})_2 * (r_i)_1$.

The first and second electrical networks are equivalent if the products match for all unknowns. As previously stated herein above, the representations may alternatively both be for the same electrical network. In this case, the representations are equivalent if the products match for all unknowns.

It should be appreciated that the present invention enables exploration of general solutions and properties of a network. That is, since the solution for a set of linear network equations can be obtained in algebraic form, analysts and designers can develop greater insights by seeing how the various parameters and combinations of parameters in the network influence the network's behaviour. Furthermore, enhanced ability to explore solutions and network properties leads to enhanced ability to choose among alternative designs, such as on the basis of cost of components, simplicity of design, etc. This is usually presented as a problem where the input and some specified outputs are required to remain the same among alternative designs, while the remaining outputs need not be. In such a situation what one is really looking for is an aid to parametric design. The present invention is an excellent aid in this respect since it allows one to see the outputs in algebraic form. In the algebraic form it is possible to see how, in two competing designs, the design parameters can be adjusted such that the specified outputs match. In this context, it is an object of the present invention to determine whether two representations of an electrical network are equivalent.

Other forms of the invention, as well as other objects and advantages will become apparent upon reading the following detailed description and upon reference to the accompanying drawings.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment read in conjunction with the accompanying drawings.

DETAILED DESCRIPTION INCLUDING BEST MODE

In the following detailed description of the preferred embodiments, reference is made to the accompanying drawings illustrating embodiments in which the invention may be practiced. It should be understood that other embodiments may be utilized and changes may be made without departing from the scope of the present invention.

Apparatus

Figure 3:
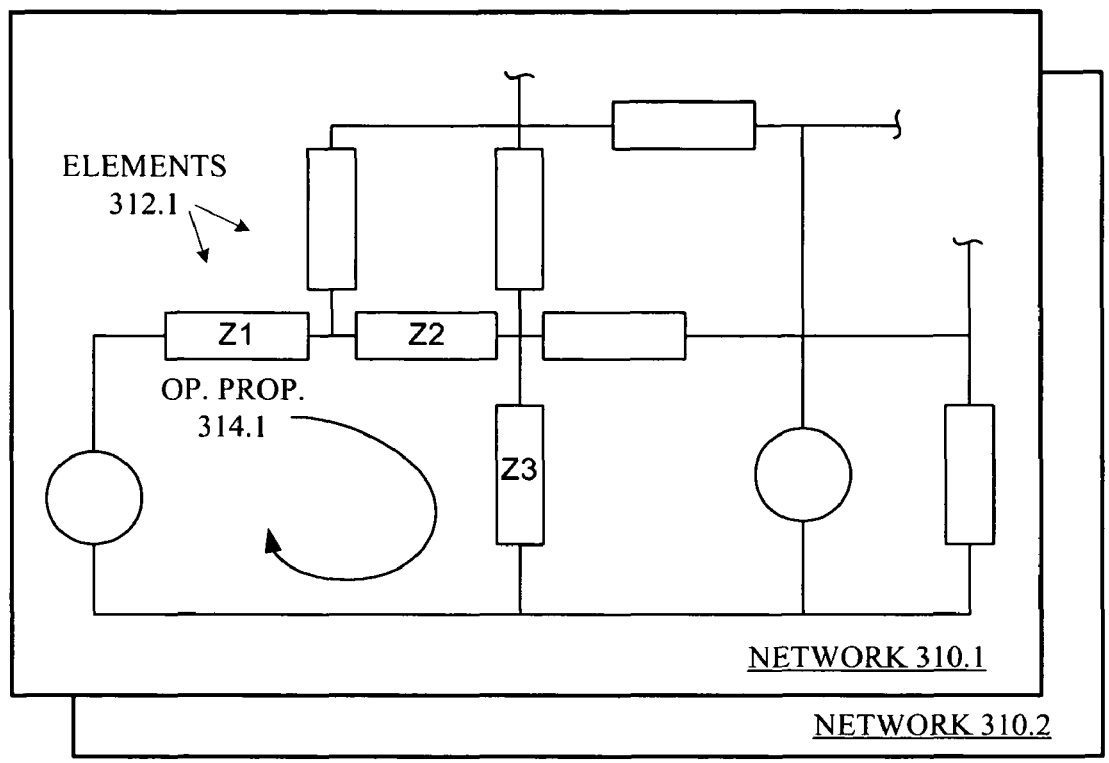
FIG. 3 illustrates two electrical networks and corresponding network representations, according to an embodiment of the present invention.

Referring now to FIG. 3, first and second electrical networks 310.1 and 310.2 are shown, according to an embodiment of the present invention. Each electrical network 310.1 and 310.2 has respective electrical elements, such as resistors, capacitors, inductors, etc. arranged in various series and parallel interconnections to form branches and loops. The networks typically include more complex devices, such as transistors, which may be represented in idealized fashion as including resistors, capacitors, etc. Electrical elements 312.1 are explicitly shown for network 310.1. (It should be understood that in similar fashion network 310.2 also has electrical elements not shown.)

Network 310.1 also has operating properties, such as, for example, loop currents and branch voltages. Accordingly, one such loop current is explicitly depicted in FIG. 3 for network 310.1 as an operating property 314.1. (It should be understood that in similar fashion network 310.2 also has operating properties not shown.) For both networks 310.1 and 310.2 the network operating properties and electrical elements according to their interconnections are represented by respective first and second electrical network representations 316.1 and 316.2, where each of the representations includes a respective set of simultaneous linear algebraic equations (SLAE's), as will be described further herein below. (It should be understood that instead of representing respective electrical networks 310.1 and 310.2, the electrical network representations 316.1 and 316.2 might be different representations of a single electrical network.) The coefficients of one such equation from one of the sets of SLAE's are for respective network elements, or combinations of elements, of the set's respective electrical network and the unknowns are for respective operating properties of the set's respective electrical network. For example, one of the equations of representation 316.1 may have a coefficient (Z1+Z2+Z3) for a combination of the network impedances in one of the loops of the corresponding network 310.1, and may have an unknown representing the loop current, shown as operating property 314.1 for network 310.1.

Figure 1:
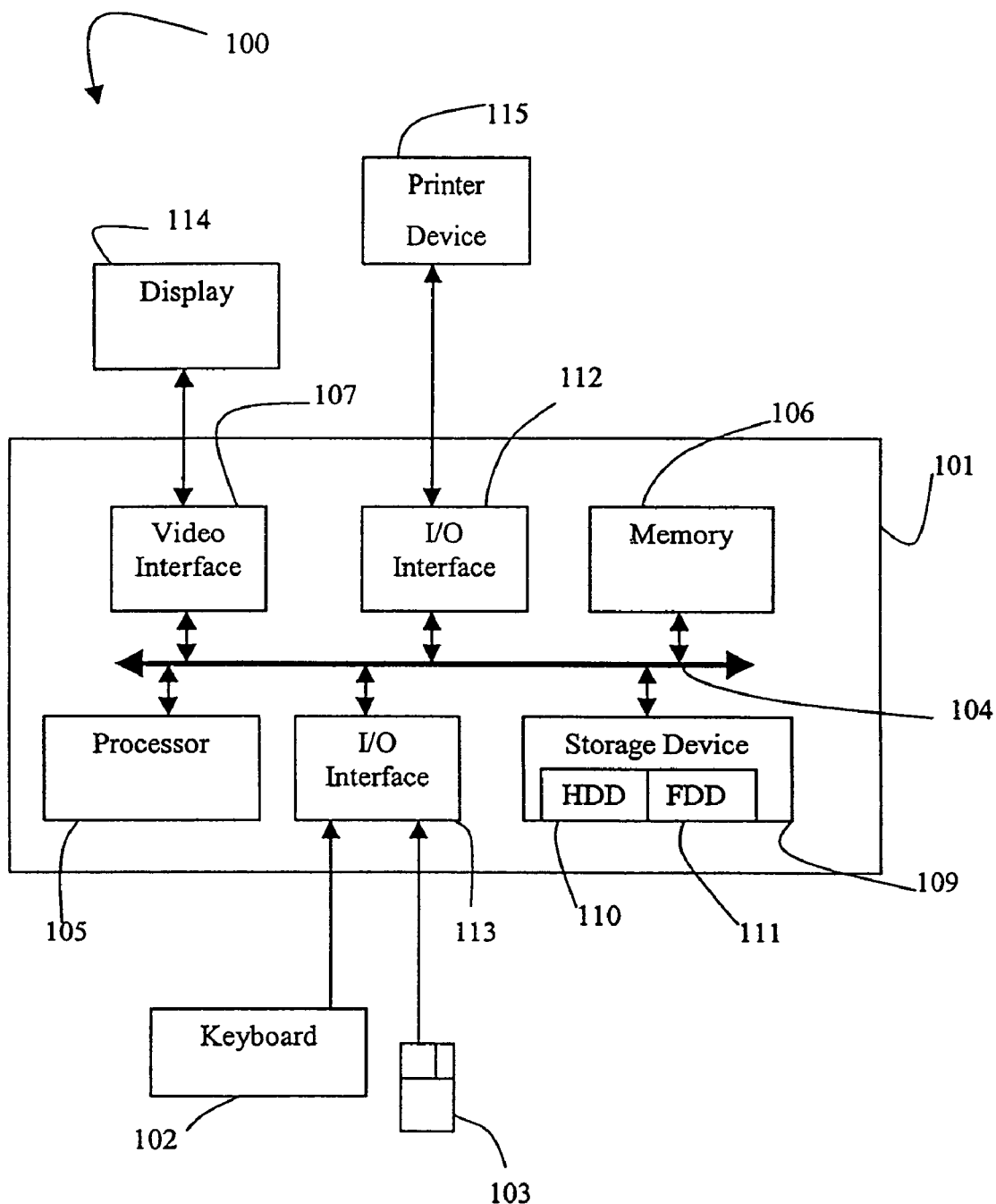
FIG. 1 is a schematic block diagram of a conventional general-purpose computer system upon which an embodiment of the present invention may be practised.

A general-purpose computer system 100, upon which aspects of the present invention may be practised, is shown in FIG. 1. The computer system 100 will first be described, followed more particularly by a description of a method of determining whether two electrical networks (or two representations of a single electrical network) are equivalent.

This method may be implemented as software, such as an application program executing within the computer system 100. In particular, the steps of such a method are effected by instructions in the software that are carried out by the computer system 100. The software may be stored in a computer readable medium, including the storage devices described below, for example. The software is loaded into the computer system 100 from the computer readable medium, and then executed by the computer system 100. A computer readable medium having such software or computer program recorded on it is a computer program product. The use of the computer program product in the computer preferably effects an advantageous apparatus for determining whether two electrical networks (or two representations of a single electrical network) are equivalent, in accordance with the embodiments of the invention.

The computer system 100 comprises a computer module 101, input devices such as a keyboard 102 and mouse 103, and output devices including a printer 115 and a display device 114. The computer module 101 typically includes at least one processor unit 105, a memory unit 106, for example formed from semiconductor random access memory (RAM) and read only memory (ROM), input/output (I/O) interfaces including a video interface 107, an I/O interface for the printer device 115 and an I/O interface 113 for the keyboard 102 and mouse 103. A storage device 109 is provided and typically includes a hard disk drive 110 and a floppy disk drive 111. A CD-ROM drive (not illustrated) may be provided as a non-volatile source of data. The components 105 to 113 of the computer module 101, typically communicate via an interconnected bus 104 and in a manner, which results in a conventional mode of operation of the computer system 100 known to those in the relevant art.

Typically, the application program of the preferred embodiment is resident on the tangible, computer readable medium of hard disk drive 110, and read and controlled in its execution by the processor 105. Intermediate storage of the program may be accomplished using semiconductor memory 106, possibly in concert with hard disk drive 110. In some instances, the application program may be supplied to the user encoded on the tangible, computer readable medium of a CD-ROM or floppy disk, and may be read via a CD-ROM drive (not illustrated) or floppy disk drive 111, or alternatively may be read by the user from a network (not illustrated) via a modem device (not illustrated). Still further, the software can also be loaded into computer system 100 from other tangible, computer readable media, such as magnetic tape, ROM, integrated circuit, magneto-optical disk, or card such as a PCMCIA card. Alternatively, the software can be loaded into the computer system 100 from a transmission medium, such as a radio frequency or infra-red transmission channel, including e-mail transmissions and the like, coupled to information stored on computer readable media on Internet or Intranet websites. The foregoing are merely examples of relevant computer readable and transmission media. Other media may be practiced without departing from the scope and spirit of the invention.

Having described the hardware environment of the invention, a method of determining whether two electrical networks (or two representations of a single electrical network) are equivalent will now be described.

Broad Outline of Method

A system of simultaneous linear algebraic equations (SLAE's) such as representation 316.1 (FIG. 3) is given by the following:

$$e_{11}x_1 + e_{12}x_2 + e_{13}x_3 + \ldots + e_{1n}x_n = b_1$$
$$e_{21}x_1 + e_{22}x_2 + e_{23}x_3 + \ldots + e_{2n}x_n = b_2$$
$$\ldots \quad \ldots \quad \ldots \quad \ldots$$
$$e_{n1}x_1 + e_{n2}x_2 + e_{n3}x_3 + \ldots + e_{nn}x_n = b_n$$

where n-unknowns $\{x_1, x_2, x_3, \ldots, x_n\}$ are related by n equations, and coefficients $e_{ij}$ (with i=1, 2, . . . , n and j=1, 2, . . . , n) are known algebraic expressions, as are the right-hand side quantities $b_i$, i=1, 2, . . . , n.

The method of determining whether two such representations 316.1 and 316.2 are equivalent—that is, their respective solutions are identical to each other—broadly has two parts, namely:

(1) The reduction of each system of SLAE's 316.1 and 316.2 into a standard form of the type $$l_{11}x_1 = r_1$$
$$l_{22}x_2 = r_2$$
$$l_{33}x_3 = r_3$$
$$\ldots \quad \ldots$$
$$l_{nn}x_n = r_n$$

where $l_{ii}$ and $r_i$ are algebraic expressions; and
(2) Comparison of two sets of SLAE's in their standard form.

It is assumed that the coefficients $e_{ij}$ and the quantities $b_i$ of the representations 316.1 and 316.2 have no division operators. Undesirable division operators can be eliminated from the representations 316.1 and 316.2 by multiplying the affected equations by appropriate factors. This is done to reduce the complexity of handling operands associated with the division operator, which is not a commutative operator.

Reduced Expression

The coefficients $e_{ij}$ and the quantities $b_i$ may be written as expressions, wherein the terms in the coefficients $e_{ij}$ and the quantities $b_i$ may include constants and variables. In the preferred embodiment, to facilitate comparisons between two expressions, the concept of a reduced form of an expression, as described below, has been used. The reduced expression is the canonical form to which expressions are converted.

It is apriori assumed that the expression to be converted is syntactically correct and does not contain any blanks. In the preferred embodiment, variables are limited in their construction to lower-case alphabets, underscore character, and digits, except that a variable may not start with a digit or end with an underscore. If these construction rules are not met, then the affected variables may be mapped (aliased) to alternative, but distinct, variables obeying the construction rules, and these new variables used instead.

A convention adopted for the present embodiment is that variables in the coefficients $e_{ij}$ and the quantities $b_i$ raised to a positive integer power are written out as multiplications of the variables. Thus, for example:

$a^n$ becomes a*a* . . . * a, where a appears n times in the product.

To convert a given expression into a reduced expression, the expression firstly is put in the following form:

<unary operator><operand><operator><operand> . . . <operator><operand> where the unary operator is either + (plus) or − (minus), and each operator is one of + (plus), − (minus), or * (multiplication). In the event that an expression does not commence with a unary operator, a unary operator + (plus) is inserted at the start of the expression. For example:

a+b*c−d becomes +a+b*c−d

Note, in particular, the absence of brackets. Brackets, if present in the expression, must be removed by carrying out the necessary operations needed to remove them, such as multiplying two parenthesised factors, discarding superfluous brackets, etc. to bring a given expression into the above form.

Next, all + (plus) operators are substituted with the string +1* so that + becomes +1*. Similarly, all − (minus) operators are substituted with the string −1* so that − becomes −1*. Thus, for example:

+a becomes +1*a and

−a*b becomes −1*a*b

Finally, the operands, which are constants, (including the 1s introduced in the previous step) are converted into an e-format as follows:

".[unsigned number]e[e-sign][unsigned exponent]"

where: [unsigned number] is a n-digited number comprising only digits and n is a prefixed integer greater than 0;
[e-sign] is the sign of the exponent and is one of > for plus or < for minus; and
[unsigned exponent] is a m-digited number comprising only digits and m is a prefixed integer greater than 0.

Thus, for example:

25=0.25*10² becomes 0.250000e>02 and 0.025=0.25*10⁻¹ becomes 0.250000e<01 where it is assumed n=6 and m=2. It is noted that any constant will be represented by a string of constant length m+n+3 characters in the e-format. Here e[e-sign] [unsigned exponent] represents the quantity 10 raised to the power [e-sign] [unsigned exponent], which must be multiplied to the number represented by [unsigned number] to get the actual constant.

Now, the expression will contain at least one operand, which is a constant. Each expression will have one or more terms, where each term has the following form:

<unary operator><operand><*><operand> . . . <*><operand> where the unary operator is either + (plus) or − (minus), and between two consecutive operands is the multiplication operator *. After the terms are identified, the [e-sign] of each constant is restored from < or > to − or + respectively.

In each term the operands are sorted (rearranged) in ascending order according to their ASCII (American Standard Code for Information Interchange) value. This does not affect the term since the multiplication operator is a commutative operator, so the exchange of operands is completely permissible. The operands, which are constants, will all bunch up at the beginning of the terms where they can be easily identified and replaced by a single constant. Thus, for example:

+0.100000e+01*a*b*0.500000e+00 after arranging the operands in ascending order becomes

+0.100000e+01*0.500000e+00*a*b and after consolidating the constants the term becomes +0.500000e+00*a*b At this stage a term will have the following form:
<unary operator><constant><*><operand> ... <*><operand>
where each operand is a variable, whose ASCII value is not lower than that of its preceding operand, if any. This is the reduced form of a term. In the reduced form, the non-constant part of a term is called a variable-group. For example, if the term in the reduced form is "+0.250000e+01*a*a*b", then its variable-group is "*a*a*b".

In an expression, all those terms whose variable-groups match are combined by modifying the constant in one of the terms and eliminating all other terms with identical variable-groups.

Finally, the reduced terms in the expression are rearranged in an ascending order according to the ASCII value of their respective variable-group. In this final form, the expression is said to be in its reduced form. Note, in particular, that no two terms in a reduced expression will have the same variable-group.

Method of Determining Equivalence

Figure 2:
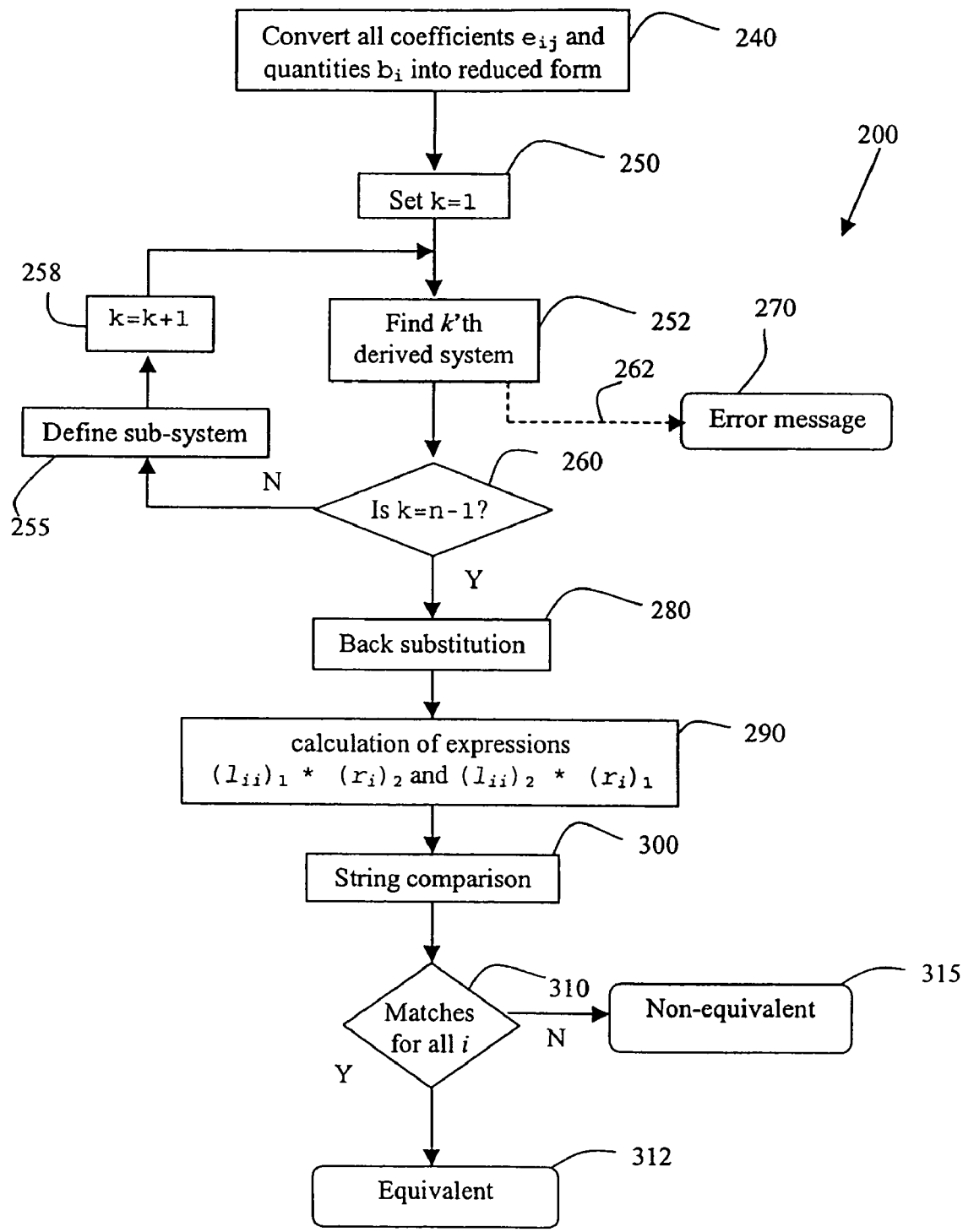
FIG. 2 is a logical algorithm, in flow diagram form, setting out aspects of an embodiment of the present invention.

Referring to FIG. 2, a method 200 of determining whether two such representations 316.1 and 316.2 are equivalent is shown. Starting in step 240, all the coefficients $e_{ij}$ and the quantities $b_i$ are converted into their respective reduced form (as discussed above).

In steps 250 to 280, the Gaussian elimination and back substitution method (adapted to avoid divisions) is used to bring the representations 316.1 and 316.2 into a standard form.

In step 250 a counter k is set to 1. Step 252 follows, where the variable $x_k$ is eliminated from the j-th equations, j=(k+1), ..., n, to get a k-th derived system. In particular, with counter k equal to 1, the variable $x_1$ is eliminated from the j-th equations, j=2, 3, ..., n, to get a first derived system defined as:

$$e_{11}x_1 + e_{12}x_2 + e_{13}x_3 + \ldots + e_{1n}x_n = b_1$$
$$^1e_{22}x_2 + {}^1e_{23}x_3 + \ldots + {}^1e_{2n}x_n = {}^1b_2$$
$$\ldots \ldots \ldots \ldots \ldots$$
$$^1e_{n2}x_2 + {}^1e_{n3}x_3 + \ldots + {}^1e_{nn}x_n = {}^1b_n$$

where the new coefficients $^1e_{jk}$ of the first derived system are given by:

$$^1e_{jk}=e_{jk}e_{11}-e_{1k}e_{j1}; \text{ and}$$

$$^1b_j=b_je_{11}-b_1e_{j1}, \text{ for } (j, k)=2, \ldots, n.$$

In a case where the coefficient $e_{11}=0$, then the first equation of the system is interchanged with any other equation m of the system for which its coefficient $e_{1m}$ is non-zero. If no such equation m can be found, then the SLAE's are singular, and the method 200, and in particular step 252, is interrupted by following the line 262 to step 270, where the is method 200 is terminated with an appropriate error message.

In step 260 it is determined whether the counter k is equal to n−1, where n is the number of unknowns. If this is not so, a sub-system is defined in step 255 from the kth derived system. For example, with counter k equal to 1, the sub-system derived from the first derived system is as follows:

$$^1e_{22}x_2 + {}^1e_{23}x_3 + \ldots + {}^1e_{2n}x_n = {}^1b_2$$
$$\ldots \ldots \ldots \ldots \ldots$$
$$^1e_{n2}x_2 + {}^1e_{n3}x_3 + \ldots + {}^1e_{nn}x_n = {}^1b_n$$

This sub-system is a set of (n−1) SLAE's, having (n−1) unknowns $\{x_2, x_3, \ldots, x_n\}$. After incrementing the counter k in step 258, the steps of reduction 252 to 260 are now repeated on the sub-systems, until the system is reduced to a (n−1)-th derived system as follows:

$$e_{11}x_1 + e_{12}x_2 + e_{13}x_3 + \ldots + e_{1n}x_n = b_1$$
$$^1e_{22}x_2 + {}^1e_{23}x_3 + + {}^1e_{2n}x_n = {}^1b_2$$
$$\ldots \ldots \ldots \ldots \ldots$$
$$^{n-1}e_{nn}x_n = {}^{n-1}b_n$$

wherein the diagonal coefficients $^{j-1}e_{jj}$, j=1, ..., n, are all nonzero, and where $$^le_{jk}={}^{l-1}e_{jk}{}^{l-1}e_{ll}-{}^{l-1}e_{lk}{}^{l-1}e_{jl},$$

$$^lb_j={}^{l-1}b_j{}^{l-1}e_{ll}-{}^{l-1}b_l{}^{l-1}e_{jl}, \text{ for } l=1, \ldots, n-1; (j, k)=l+1, \ldots, n,$$

and $$^0e_{jk}=e_{jk}.$$

This completes the Gaussian elimination phase of the process. Note the absence of any division in the entire process. The counter k is now equal to n−1 and the method therefore continues to step 280 where back substitution is performed, again without any division. Therefore, instead of calculating the unknown $x_i$, the product $l_{ii}x_i$ is calculated, where each of the n unknowns $x_i$ is expressed in the form of a ratio $x_i=r_i/l_{ii}$ with $r_i$ a numerator and $l_{ii}$ a denominator. With i=n, we have, $$^{n-1}e_{nn}x_n={}^{n-1}b_n$$

so that $$l_{nn}={}^{n-1}e_{nn} \text{ and } r_n={}^{n-1}b_n.$$

For i=n−1, the (n−1)-th equation is multiplied by the denominator $l_{nn}$ to obtain $$l_{nn}{}^{n-2}e_{n-1,n-1}x_{n-1}+l_{nn}{}^{n-2}e_{n-1,n}x_n={}^{n-2}b_{n-1}l_{nn}$$

or $$l_{nn}{}^{n-2}e_{n-1,n-1}x_{n-1}={}^{n-2}b_{n-1}l_{nn}-{}^{n-2}e_{n-1,n}r_n$$

so that $$l_{n-1,n-1}=l_{nn}{}^{n-2}e_{n-1,n-1} \text{ and } r_{n-1}={}^{n-2}b_{n-1}l_{nn}-{}^{n-2}e_{n-1,n}r_n$$

For i=n−2, we multiply the (n−2)-th equation by the denominator $l_{n-1, n-1}$ and obtain $$l_{n-1,n-1}{}^{n-3}e_{n-2,n-2}x_{n-2}+l_{n-1,n-1}{}^{n-3}e_{n-2,n-1}x_{n-1}+l_{n-1,n-1}{}^{n-3}e_{n-2,n}x_n={}^{n-3}b_{n-2}l_{n-1,n-1}$$

or $$l_{n-1,n-1}{}^{n-3}e_{n-2,n-2}x_{n-2}={}^{n-3}b_{n-2}l_{n-1,n-1}-{}^{n-2}e_{n-1,n-1}{}^{n-3}e_{n-2,n}r_n-{}^{n-3}e_{n-2,n-1}r_{n-1}$$

so that $$l_{n-2,n-2}=l_{n-1,n-1}{}^{n-3}e_{n-2,n-2} \text{ and}$$
$$r_{n-2}={}^{n-3}b_{n-2}l_{n-1,n-1}-{}^{n-3}e_{n-2,n}r_n-n^3e_{n-2,n-1}r_{n-1}$$

It can be shown that for any i=1, 2, ..., n−1, the result will be $$l_{ii} = l_{i+1,\,i+1}{}^{i-1} e_{ii} \text{ and } r_i = l^{i-1} b_i l_{i+1,\,i+1} - R_{in} r_n - R_{i,\,n-1} r_{n-1} - \ldots - R_{i,\,i+1} r_{i+1}$$

with $$l_{nn} = {}^{n-1} e_{nn} \text{ and } r_n = {}^{n-1} b_n$$

where $$R_{ij} = (l_{i+1,\,i+1}/l_{jj})^{i-1} e_{ij} \text{ for } j = n, \ldots, (i+1) \text{ and } i = 1, 2, \ldots, n-1.$$

Note that since $l_{jj}$ is a factor of $l_{i+1,\,i+1}$, $R_{ij}$ will be free of any divisions. However, it is noted that there is no step in the back substitution step 280 where factors common to $l_{ii}$ and $r_i$ have been eliminated.

After completing steps 240 to 280 for each of the two representations 316.1 and 316.2, string arrays $(l_{ii})_1$ and $(r_i)_1$ for representation 316.1 and $(l_{ii})_2$ and $(r_i)_2$ for representation 316.2 have been produced. In principle, to show that the solutions of the two representations 316.1 and 316.2 are equivalent, it would suffice if their respective string arrays $l_{ii}$ and $r_i$ where shown to match. However, this cannot always be done, since it is generally not possible to eliminate their common factors completely by presently known methods. It must therefore be assumed that there may be uneliminated common factors present. However, it is clear that mathematically $$(l_{ii}/r_i)_1 = (l_{ii}/r_i)_2$$

or equivalently, $$(l_{ii})_1 * (r_i)_2 = (l_{ii})_2 * (r_i)_1$$

in which form a comparison may be performed. Therefore, step 290 calculates expressions $(l_{ii})_1 * (r_i)_2$ and $(l_{ii})_2 * (r_i)_1$ for each i=1, ..., n. If all the expressions $(l_{ii})_1 * (r_i)_2$ and $(l_{ii})_2 * (r_i)_1$ have been consistently reduced to their reduced form, then a step 300 performs a simple string comparison of $(l_{ii})_1 * (r_i)_2$ with $(l_{ii})_2 * (r_i)_1$. A decision step 310 determines whether matches were found for all i=1, ..., n. If the answer is Yes, then equivalence of representations 316.1 and 316.2 is reported in step 312. Alternatively, non-equivalence is reported in step 315.

EXAMPLE

An example of performing the method 200, to determine whether two representations 316.1 and 316.2 are equivalent, will now be described. C and C++ programming language notations will be used. In this notation, the coefficients $e_{ij}$ and the quantities $b_i$ are denoted as e[i−1][j−1] and b[i−1] respectively.

To understand the example given below, reference to the following pseudo-code fragment will be helpful. The variables e [ ] [ ] and b [ ] are assumed to have the datatype algebraic expression, which inter alia will implement the operators + (plus), − (minus), and * (multiplication) operators on such expressions. The class expression also has a method, which can convert an algebraic expression into its reduced form.

```
// Gaussian elimination
// e[ ][ ] and b[ ] are of type Expression.
for (i = 0; i < n−1; i++) { // Index for the derived system.
    // --- Comment 1 ---
    // If e[i][i] = 0, exchange this row with another below it (say
    // the k-th row, k > i) such that e[i][k] != 0. If no such k is
    // found, exit with the message that the matrix e is singular.
    // The code to do this is not shown here.
    for (j = i+1; j < n; j++) {
        for (k = i+1; k < n; k++) {
            // Multiply i-th row with e[j][i].
            // Multiply j-th row with e[i][i].
            // Subtract i-th row from j-th row.
            e[j][k] = e[j][k]*e[i][i] − e[i][k]*e[j][i];
        }
        b[j] = b[j]*e[i][i] − b[i]*e[j][i];
    }
    // Zero lower triangle coefficients
    for (k = 0; k < i; k++) e[i][k] = "0";
}
// Back-substitute.
i = n;
// At the end of the following while loop, e[i−1][i−1] will
// contain $l_{ii}$
// and b[i−1] will contain $r_i$. The solution will be $x_i = l_{ii}/r_i$.
while (i−−) {
    j = n;
    while (j−−) b[j] = b[j]*e[i][i] − b[i]*e[j][i];
    for(k = 0; k < n; k++) {
        for (j = k; j < n; j++) {
            e[k][j] *= e[i][i];
        }
    }
}
```

Now, let representation 316.1 be the set of equations:

$$ax_1 + x_2 + x_3 = a+2$$

$$x_1 + x_2 + x_3 = 3$$

$$x_1 + x_2 - x_3 = 1$$

and let representation 316.2 be the set of equations $$ax_1 + 2x_2 = a+2$$

$$2x_1 + 2x_2 = 4$$

$$x_2 - x_3 = 0$$

That is, each set consists of three equations.

Considering representation 316.1 first, the coefficients $e_{ij}$ and the quantities $b_i$ may be written as follows:
e[0][0]=a
e[0][1]=1
e[0][2]=1
b[0]=a+2
e[1][0]=1
e[1][1]=1
e[1][2]=1
b[1]=3
e[2][0]=1
e[2][1]=1
e[2][2]=−1
b[2]=1

Performing step 240 in representation 316.1, all the above terms are converted by the computer program performing method 200 into a reduced form, with the text variable to which a pseudocode variable refers to at different stages of computation noted on the right hand side, as follows:

| Reduced Form | Variables |
|---|---|
| e[0][0] = +.10000e+01*a | $^0e_{11} = e_{11}$ |
| e[0][1] = +.10000e+01 | $^0e_{12} = e_{12}$ |
| e[0][2] = +.10000e+01 | $^0e_{13} = e_{13}$ |
| b[0] = +.10000e+01*a+.20000e+01 | $^0b_1 = b_1$ |
| e[1][0] = +.10000e+01 | $^0e_{21} = e_{21}$ |
| e[1][1] = +.10000e+01 | $^0e_{22} = e_{22}$ |
| e[1][2] = +.10000e+01 | $^0e_{23} = e_{23}$ |
| b[1] = +.30000e+01 | $^0b_2 = b_2$ |
| e[2][0] = +.10000e+01 | $^0e_{31} = e_{31}$ |
| e[2][1] = +.10000e+01 | $^0e_{32} = e_{32}$ |
| e[2][2] = −.10000e+01 | $^0e_{33} = e_{33}$ |
| b[2] = +.10000e+01 | $^0b_3 = b_3$ |

With counter k set to 1 in step 250, a first derived system is found by performing step 252, thereby eliminating the variable $x_1$ from equations 2 and 3. The coefficients $^1e_{ij}$ and the quantities $^1b_i$ of the first derived system are as follows:

| Reduced Form | Variables |
|---|---|
| e[0][0] = +.10000e+01*a | $^0e_{11}$ |
| e[0][1] = +.10000e+01 | $^0e_{12}$ |
| e[0][2] = +.10000e+01 | $^0e_{13}$ |
| b[0] = +.10000e+01*a+.20000e+01 | $^0b_1$ |
| e[1][0] = +.00000e+00 | $^1e_{21}$ |
| e[1][1] = −.10000e+01+.10000e+01*a | $^1e_{22}$ |
| e[1][2] = −.10000e+01+.10000e+01*a | $^1e_{23}$ |
| b[1] = −.20000e+01+.20000e+01*a | $^1b_2$ |
| e[2][0] = +.00000e+00 | $^1e_{31}$ |
| e[2][1] = −.10000e+01+.10000e+01*a | $^1e_{32}$ |
| e[2][2] = −.10000e+01−.10000e+01*a | $^1e_{33}$ |
| b[2] = −.20000e+01 | $^1b_3$ |

The above first derived system for representation 316.1, when written in normal algebraic form, appears as:

$$ax_1+x_2+x_3=a+2$$

$$(a-1)x_2+(a-1)x_3=2(a-1)$$

$$(a-1)x_2-(a+1)x_3=-2$$

By repeating steps 250 to 260, the method 200 calculates the second derived system for representation 316.1 as follows:

| Reduced Form | Variables |
|---|---|
| e[0][0] = +.10000e+01*a | $^0e_{11}$ |
| e[0][1] = +.10000e+01 | $^0e_{12}$ |
| e[0][2] = +.10000e+01 | $^0e_{13}$ |
| b[0] = +.10000e+01*a+.20000e+01 | $^0b_1$ |
| e[1][0] = +.00000e+00 | $^1e_{21}$ |
| e[1][1] = −.10000e+01+.10000e+01*a | $^1e_{22}$ |
| e[1][2] = −.10000e+01+.10000e+01*a | $^1e_{23}$ |
| b[1] = −.20000e+01+.20000e+01*a | $^1b_2$ |
| e[2][0] = +.00000e+00 | $^2e_{31}$ |
| e[2][1] = +.00000e+00 | $^2e_{32}$ |
| e[2][2] = +.20000e+01*a−.20000e+01*a*a | $^2e_{33} = l_{33}$ |
| b[2] = +2.0000e+00*a−2.0000e+00*a*a | $^2b_3 = r_3$ |
| or alternatively | |
| $ax_1 + x_2 + x_3 = a + 2$ | |
| $(a - 1)x_2 + (a - 1)x_3 = 2(a - 1)$ | |
| $-2a (a - 1)x_3 = -2a(a - 1)$ | |

Performing the back substitution step 280 the numerators $r_i$ and the denominators $l_{ii}$ can be found. In particular, from the last equation of the second derived system the numerator $r_3$ and the denominator $l_{33}$ are as follows:

$$l_{33} = -2a(a-1) \text{ and } r_3 = -2a(a-1).$$

Substituting numerator $r_3$ and denominator $l_{33}$ into the second equation, we get:

| Reduced Form | Variables |
|---|---|
| e[1][1] = −.20000e+01*a+.40000e+01*a*a−.20000e+01*a*a*a | $l_{22}$ |
| b[1] = −.20000e+01*a+.40000e+01*a*a−.20000e+01*a*a*a | $r_2$ |
| or | |
| $l_{22} = -2a(1 - 2a + a^2)$ and $r_2 = -2a(1 - 2a + a^2)$. | |

In the final back substitution we get

| Reduced Form | Variables |
|---|---|
| e[0][0] = −.40000e + 01 ∗ a ∗ a ∗ a + .12000e + 02 ∗ a ∗ a ∗ a ∗ a − .12000e + 02 ∗ a ∗ a ∗ a ∗ a ∗ a + .40000e + 01 ∗ a ∗ a ∗ a ∗ a ∗ a ∗ a | $l_{11}$ |
| b[0] = −.40000e + 01 ∗ a ∗ a ∗ a + .12000e + 02 ∗ a ∗ a ∗ a ∗ a − .12000e + 02 ∗ a ∗ a ∗ a ∗ a ∗ a + .40000e + 01 ∗ a ∗ a ∗ a ∗ a ∗ a ∗ a | $r_1$ | producing thereby
$l_{11} = -4a^3 (1 - 3a + 3a^2 - a^3)$ and $r_1 = -4a^3 (1 - 3a + 3a^2 - a^3)$.

In a similar manner, the first derived system of representation 316.2 may be written as follows:

| Reduced Form | Variables |
|---|---|
| e[0][0] = +.10000e+01*a | $^0e_{11}$ |
| e[0][1] = +.20000e+01 | $^0e_{12}$ |
| e[0][2] = +.00000e+00 | $^0e_{13}$ |
| b[0] = +.10000e+01*a+.20000e+01 | $^0b_1$ |
| e[1][0] = +.00000e+00 | $^1e_{21}$ |
| e[1][1] = −.40000e+01+.20000e+01*a | $^1e_{22}$ |
| e[1][2] = +.00000e+00 | $^1e_{23}$ |
| b[1] = −.40000e+01+.20000e+01*a | $^1b_2$ |
| e[2][0] = +.00000e+00 | $^1e_{31}$ |
| e[2][1] = +.10000e+01*a | $^1e_{32}$ |
| e[2][2] = −.10000e+01*a | $^1e_{33}$ |
| b[2] = +.00000e+00 | $^1b_3$ |
| or | |
| $ax_1 + 2x_2 = a + 2$ | |
| $2 (a - 2)x_2 = 2 (a - 2)$ | |
| $ax_2 - ax_3 = 0$ | |

The second derived system for representation 316.2 is as follows:

| Reduced Form | Variables |
|---|---|
| e[0][0] = +.10000e+01*a | $^0e_{11}$ |
| e[0][1] = +.20000e+01 | $^0e_{12}$ |

-continued

| Reduced Form | Variables |
|---|---|
| e[0][2] = +.00000e+00 | $^0e_{13}$ |
| b[0] = +.10000e+01*a+.20000e+01 | $^0b_1$ |
| e[1][0] = +.00000e+00 | $^1e_{21}$ |
| e[1][1] = −.40000e+01+.20000e+01*a | $^1e_{22}$ |
| e[1][2] = +.00000e+00 | $^1e_{23}$ |
| b[1] = −.40000e+01+.20000e+01*a | $^1b_2$ |
| e[2][0] = +.00000e+00 | $^2e_{31}$ |
| e[2][1] = +.10000e+01*a | $^2e_{32}$ |
| e[2][2] = +.40000e+01*a−.20000e+01*a*a | $^2e_{33} = l_{33}$ |
| b[2] = +.40000e+01*a−.20000e+01*a*a | $^2b_3 = r_3$ |
| or | |
| $ax_1 + 2x_2 = a + 2$ | |
| $2(a − 2)x_2 = 2(a − 2)$ | |
| $2a(2 − a)x_3 = 2a(2 − a)$ | |

Again performing the back substitution step 280 with representation 316.2 the numerators $r_i$ and the denominators $l_{ii}$ can be found. The numerator $r_3$ and the denominator $l_{33}$ are as follows:

$l_{33} = 2a(2−a)$ and $r_3 = 2a(2−a)$.

Substituting numerator $r_3$ and denominator $l_{33}$ into the second equation, we get:

| Reduced Form | Variables |
|---|---|
| e[1][1] = −.16000e+02*a+.16000e+02*a*a− .40000e+01*a*a*a | $l_{22}$ |
| b[1] = −.16000e+02*a+.16000e+02*a*a− .40000e+01*a*a*a | $r_2$ | or
$l_{22} = −4a(4 − 4a + a^2)$ and $r_2 = −4a(4 − 4a + a^2)$.
In the final back substitution we get

| | |
|---|---|
| e[0][0] = −.64000e+02*a*a*a+ .96000e+02*a*a*a*a− .48000e+02*a*a*a*a*a+ .80000e+01*a*a*a*a*a*a | $l_{11}$ |
| b[0] = −.64000e+02*a*a*a+ .96000e+02*a*a*a*a− .48000e+02*a*a*a*a*a+ .80000e+01*a*a*a*a*a*a | $r_1$ | or
$l_{11} = −8a^3(8 − 12a + 6a^2 − a^3)$ and $r_1 = −8a^3(8 − 12a + 6a^2 − a^3)$.

Performing step 290, the expressions $(l_{ii})_1 *(r_i)_2$ and $(l_{ii})_2 *(r_i)_1$ are calculated and reduced to their reduced forms. For example, calculating $(l_{22})_1 *(r_2)_2$ gives the following:

$(l_{22})_1 * (r_2)_2 =$ $(−.20000e + 01 * a + .40000e + 01 * a * a − .20000e + 01 * a * a * a) *$ $(−.16000e + 02 * a + .16000e + 02 * a * a − .40000e +$ $01 * a * a * a) = +.32000e + 02 * a * a − .32000e + 02 * a * a * a +$ $.80000e + 01 * a * a * a * a − .64000e + 02 * a * a * a +$ $.64000e + 02 * a * a * a * a − .16000e + 02 * a * a * a * a * a +$ $.32000e + 02 * a * a * a * a − .32000e + 02 * a * a * a * a * a +$ $.80000e + 01 * a * a * a * a * a * a = +.32000e + 02 * a * a −$ $.96000e + 02 * a * a * a + .10400e + 03 * a * a * a * a −$ $.48000e + 02 * a * a * a * a * a + .80000e + 01 * a * a * a * a * a * a$

Similarly, calculating $(l_{22})_2 *(r_2)_1$ gives the following:

$(l_{22})_2 * (r_2)_1 =$ $(−.16000e + 02 * a + .16000e + 02 * a * a − .40000e + 01 * a * a * a) *$ $(−.20000e + 01 * a + .40000e + 01 * a * a − .20000e +$ $01 * a * a * a) = +.32000e + 02 * a * a − .64000e +$ $02 * a * a * a + .32000e + 02 * a * a * a * a − .32000e +$ $02 * a * a * a + .64000e + 02 * a * a * a * a − .32000e +$ $02 * a * a * a * a * a + .80000e + 01 * a * a * a * a − .16000e +$ $02 * a * a * a * a * a + .80000e + 01 * a * a * a * a * a * a =$ $+.32000e + 02 * a * a − .96000e + 02 * a * a * a +$ $.10400e + 03 * a * a * a * a − .48000e +$ $02 * a * a * a * a * a + .80000e + 01 * a * a * a * a * a * a$

Step 290 similarly calculates the expressions $(l_{ii})_1 *(r_i)_2$ and $(l_{ii})_2 *(r_i)_1$ for i=1 and i=3. A simple string comparison of $(l_{22})_1 *(r_2)_2$ with $(l_{22})_2 *(r_2)_1$, performed in step 300, shows that these expressions match. By repeating the comparison of $(l_{ii})_1 *(r_i)_2$ with $(l_{ii})_2 *(r_i)_1$ for i=1 and i=3, and finding that the expressions match for each i=1, 2 and 3, it can be shown that representation 316.1 is equivalent to representation 316.2.

It should be appreciated from the foregoing that the present invention enables determining equivalency when results are in algebraic form, not just in numerical form. Therefore, the invention makes possible analysis of a network and comparison of two networks, without the design parameters being specified numerically beforehand. Numerical values for the parameters can be chosen after the system has been analysed. This provides flexibility in the design of large networks (that is, networks described by a large number of simultaneous linear algebraic equations) by providing greater visibility regarding the interaction among the parameters, something that is not possible with existing methods. This visibility of parameter interactions allows designers to see useful parameter combinations, which otherwise are likely to be missed in a purely numerical computation. Existing methods force one to choose numerical values for the parameters, analyse the system, re-choose parameter values, analyse the system once again, and so on till one hits upon a set of parameter values which are considered satisfactory. The present invention reduces this part of the laborious iterative process currently followed by designers, since it allows the parameters to be chosen later.

The foregoing describes only some embodiments of the present invention, and modifications and/or changes can be made thereto without departing from the scope and spirit of the invention, the embodiments being illustrative and not restrictive. For example, the equivalence of more than two sets of simultaneous linear algebraic equations may be determined by pair-wise comparing the sets for equivalence. Embodiments of the invention can be implemented within compilers, for example. As is well known, a compiler generates machine executable object code from high-level source code, written in languages such as C++. Moreover, while the focus above is on electrical networks in control systems, it should be understood the present invention is also relevant for electrical networks in other applications and for mechanical dynamic systems, such as aircraft, motor vehicles, etc. These systems are largely designed and analysed about their operating points using linearized theories. Such analyses usually end up in the specification of a large set of simultaneous linear algebraic equations, which must then be solved. Because of the common mathematical structure they share with electrical networks, namely the set of simultaneous linear algebraic equations, these mechanical systems are often studied by simulation using electrical networks.

In addition to the objects and advantages described herein above, it should be appreciated that in situations where a coefficient matrix happens to be ill-conditioned and hence expected to produce large errors in the solution, the present invention can obviate the problem by mapping one or more numerical values appearing in the coefficient matrix to respective algebraic variables, and the solution obtained in algebraic form. The final solution can then be obtained by replacing the introduced algebraic variables with their corresponding numerical values.

To reiterate, many additional aspects, modifications and variations are also contemplated and are intended to be encompassed within the scope of the following claims. Moreover, it should be understood that in the following claims actions are not necessarily performed in the particular sequence in which they are set out.

I claim:

1. A method, comprising the steps of:
receiving, by a computer system, first information for a first representation of an electrical network, wherein the first representation of the electrical network includes a first set of simultaneous linear algebraic equations (SLAE's);
receiving, by the computer system, second information for a second representation of an electrical network, wherein the second representation of the electrical network includes a second set of SLAE's and the computer system stores the first and second information on a computer readable medium, wherein the equations of the first and second sets of SLAE's include a number of unknowns and have coefficients for the respective unknowns, a number of the coefficients being expressed in algebraic form, and wherein the coefficients of one such equation from one of the sets of SLAE's are for respective elements of the set's respective electrical network and the unknowns are for respective operating properties of the set's respective electrical network;
deriving, by the computer system, a certain pair of results for each unknown of each respective one of the SLAE's, the results being derived from the respective sets of SLAE's and stored by the computer system on a computer readable medium;
expressing the respective results for the respective unknowns as respective result text strings in predetermined text formats, the result text strings representing respective algebraic expressions having algebraic variables and numeric constants; and
comparing, by the computer system, the pairs of results to determine a network equivalence, wherein the comparing of the pairs of results includes string comparisons of the respective algebraic expression[s] representations.

2. The method of claim 1, wherein the first and second network representations are for respective first and second electrical networks and the network equivalence is for equivalence of the first and second electrical networks.

3. The method of claim 1, wherein the first and second network representations are both for a same electrical network and the network equivalence is for equivalence of the first and second representations.

4. The method of claim 1, wherein the deriving of such a pair of results for an unknown of the respective sets of SLAE's includes:
forming a first product for a first one of the results in such a pair, the first product including a first part of a first standard form equation derived from the first set of SLAE's and second part of a second standard form equation derived from the second set of SLAE's; and
forming a second product for a second one of the results in such a pair, the second product including a second part of the first one of the standard form equations derived from the first set of SLAE's and a first part of the second one of the standard form equations derived from the second set of SLAE's, and wherein the comparing of the pairs of results includes comparing respective ones of such first and second products.

5. The method of claim 4, wherein the equations of the SLAE's are of a form:

$$e_{i1}x_1+e_{i2}x_2+e_{i3}x_3+\ldots+e_{in}x_n=b_i$$

wherein $x_j$ are the unknowns, $e_{ij}$ are the coefficients, and $b_i$ are quantities, and wherein the deriving of the pair of results for an unknown of the respective sets of SLAE's includes:
forming a first one of the standard form equations derived from the first set of SLAE's in a form:

$$(l_{ii})_k x_i = (r_i)_k$$

with $k=1$, $(l_{ii})_1$ forming the first part of the equation and $(r_i)_1$ forming the second part of the equation, wherein $(l_{ii})_1$ and $(r_i)_1$ both have respective algebraic variables and numeric constants; and
forming a second one of the standard form equations derived from the second set of SLAE's in a form:

$$(l_{ii})_k x_i = (r_i)_k$$

with $k=2$, $(l_{ii})_2$ forming the first part of the equation and $(r_i)_2$ forming the second part of the equation, wherein $(l_{ii})_2$ and $(r_i)_2$ both have respective algebraic variables and numeric constants.

6. The method of claim 5, wherein a first such product includes $(l_{ii})_1 * (r_i)_2$ and a second such product includes $(l_{ii})_2 * (r_i)_1$ and the comparing of respective pairs of results includes string comparisons of text strings representing the products $(l_{ii})_1 * (r_i)_2$ and $(l_{ii})_2 * (r_i)_1$.

7. A system comprising:
a processor; and
a storage device connected to the processor, wherein the storage device is for storing a program for controlling the processor on a computer readable medium, and wherein the processor is operative with the program to execute the program for performing the steps of:
receiving, by a computer system, first information for a first representation of an electrical network, wherein the first representation includes a first set of simultaneous linear algebraic equations (SLAE's);
receiving, by the computer system, second information for a second representation of an electrical network, wherein the second representation includes a second set of SLAE's and the computer system stores the first and second information on a computer readable medium, wherein the equations of the first and second sets of SLAE's include a number of unknowns and have coefficients for the respective unknowns, a number of the coefficients being expressed in algebraic form, and wherein the coefficients of one such equation from one of the sets of SLAE's are for respective elements of the set's respective electrical network and the unknowns are for respective operating properties of the set's respective electrical network;

deriving a certain pair of results for each unknown of each respective one of the SLAE's, the results being derived from the respective sets of SLAE's and stored by the computer system on a computer readable medium;

expressing the respective results for the respective unknowns as respective result text strings in predetermined text formats, the result text strings representing respective algebraic expressions having algebraic variables and numeric constants; and comparing the pairs of results to determine a network equivalence, wherein the comparing of the pairs of results includes string comparisons of the respective algebraic expression[s] representations.

8. The system of claim 7, wherein the first and second network representations are for respective first and second electrical networks and the network equivalence is for equivalence of the first and second electrical networks.

9. The system of claim 7, wherein the first and second network representations are both for a same electrical network and the network equivalence is for equivalence of the first and second representations.

10. The system of claim 7, wherein the deriving of such a pair of results for an unknown of the respective sets of SLAE's includes:

forming a first product for a first one of the results in such a pair, the first product including a first part of a first standard form equation derived from the first set of SLAE's and second part of a second standard form equation derived from the second set of SLAE's; and forming a second product for a second one of the results in such a pair, the second product including a second part of the first one of the standard form equations derived from the first set of SLAE's and a first part of the second one of the standard form equations derived from the second set of SLAE's, and wherein the comparing of the pairs of results includes comparing respective ones of such first and second products.

11. The system of claim 10, wherein the equations of the SLAE's are of a form:

$$e_{i1}x_1 + e_{i2}x_2 + e_{i3}x_3 + \ldots + e_{in}x_n = b_i$$

wherein $x_j$ are the unknowns, $e_{ij}$ are the coefficients, and $b_i$ are quantities, and wherein the deriving of the pair of results for an unknown of the respective sets of SLAE's includes:

forming a first one of the standard form equations derived from the first set of SLAE's in a form:

$$(l_{ii})_k x_i = (r_i)_k$$

with k =1, $(l_{ii})_1$ forming the first part of the equation and $(r_i)_1$ forming the second part of the equation, wherein $(l_{ii})_1$ and $(r_i)_1$ both have respective algebraic variables and numeric constants; and forming a second one of the standard form equations derived from the second set of SLAE's in a form:

$$(l_{ii})_k x_i = (r_i)_k$$

with k =2, $(l_{ii})_2$ forming the first part of the equation and $(r_i)_2$ forming the second part of the equation, wherein $(l_{ii})_2$ and $(r_i)_2$ both have respective algebraic variables and numeric constants.

12. The system of claim 11, wherein a first such product includes $(l_{ii})_1 * (r_i)_2$ and a second such product includes $(l_{ii})_1 * (r_i)_1$ and the comparing of respective pairs of results includes string comparisons of text strings representing the products $(l_{ii})_1 * (r_i)_2$ and $(l_{ii})_2 * (r_i)_1$.

13. A computer program product comprising a computer program on a computer readable storage medium having computer readable program code, the program code comprising:

first instructions for receiving, by a computer system, first information for a first representation of an electrical network, wherein the first representation includes a first set of simultaneous linear algebraic equations (SLAE's);

second instructions for receiving, by the computer system, second information for a second representation of an electrical network, wherein the second representation includes a second set of SLAE's and the computer system stores the first and second information on a computer readable medium, wherein the equations of the first and second sets of SLAE's include a number of unknowns and have coefficients for the respective unknowns, a number of the coefficients being expressed in algebraic form, and wherein the coefficients of one such equation from one of the sets of SLAE's are for respective elements of the set's respective electrical network and the unknowns are for respective operating properties of the set's respective electrical network;

third instructions for deriving, by the computer system, a certain pair of results for each unknown of each respective one of the SLAE's and stored by the computer system on a computer readable medium, the results being derived from the respective sets of SLAE's;

fourth instructions for expressing the respective results for the respective unknowns as respective result text strings in predetermined text formats, the result text strings representing respective algebraic expressions having algebraic variables and numeric constants; and fifth instructions for comparing, by the computer system, the pairs of results to determine a network equivalence, wherein the comparing of the pairs of results includes comparisons of the respective algebraic expression[s] representations.

14. The computer program product of claim 13, wherein the first and second network representations are for respective first and second electrical networks and the network equivalence is for equivalence of the first and second electrical networks.

15. The computer program product of claim 13, wherein the first and second network representations are both for a same electrical network and the network equivalence is for equivalence of the first and second representations.

16. The computer program product of claim 13, wherein the deriving of such a pair of results for an unknown of the respective sets of SLAE's includes:

forming a first product for a first one of the results in such a pair, the first product including a first part of a first standard form equation derived from the first set of SLAE's and second part of a second standard form equation derived from the second set of SLAE's; and forming a second product for a second one of the results in such a pair, the second product including a second part of the first one of the standard form equations derived from the first set of SLAE's and a first part of the second one of the standard form equations derived from the second set of SLAE's, and wherein the comparing of the pairs of results includes comparing respective ones of such first and second products.

17. The computer program product of claim 16, wherein the equations of the SLAE's are of a form:

$$e_{i1}x_1+e_{i2}x_2+e_{i3}x_3+\ldots+e_{in}x_n=b_i$$

wherein $x_j$ are the unknowns, $e_{ij}$ are the coefficients, and $b_i$ are quantities, and wherein the deriving of the pair of results for an unknown of the respective sets of SLAE's includes:

forming a first one of the standard form equations derived from the first set of SLAE's in a form:

$$(l_{ii})_k x_i = (r_i)_k$$

with k =1, $(l_{ii})_1$ forming the first part of the equation and $(r_i)_1$ forming the second part of the equation, wherein $(l_{ii})_1$ and $(r_i)_1$ both have respective algebraic variables and numeric constants; and forming a second one of the standard form equations derived from the second set of SLAE's in a form:

$$(l_{ii})_k x_i = (r_i)_k$$

with k =2, $(l_{ii})_2$ forming the first part of the equation and $(r_i)_2$ forming the second part of the equation, wherein $(l_{ii})_2$ and $(r_i)_2$ both have respective algebraic variables and numeric constants.

18. The computer program product of claim 17, wherein a first such product includes $(l_{ii})_1 * (r_i)_2$ and a second such product includes $(l_{ii})_2 * (r_i)_1$ and the comparing of respective pairs of results includes string comparisons of text strings representing the products $(l_{ii})_1 * (r_i)_2$ and $(l_{ii})_2 * (r_i)_1$.

* * * * *